United States Patent [19]

Cathey

[11] Patent Number: 5,082,524
[45] Date of Patent: Jan. 21, 1992

[54] ADDITION OF SILICON TETRABROMIDE TO HALOGENATED PLASMAS AS A TECHNIQUE FOR MINIMIZING PHOTORESIST DETERIORATION DURING THE ETCHING OF METAL LAYERS.

[75] Inventor: David A. Cathey, Boise, Id.

[73] Assignee: Micron Technology, Inc., Boise, Id.

[21] Appl. No.: 559,959

[22] Filed: Jul. 30, 1990

[51] Int. Cl.$^5$ ............................ B44C 1/22; C23F 1/02
[52] U.S. Cl. ................................. 156/643; 156/646; 156/656; 156/659.1; 156/665; 252/79.1; 430/318; 437/245
[58] Field of Search ................. 204/192.32, 192.35; 156/643, 646, 656, 659.1, 664, 665; 252/79.1; 427/38, 39; 430/313, 314, 318; 437/245

[56] References Cited

U.S. PATENT DOCUMENTS 4,855,015  8/1989  Douglas ...................... 204/192.35 X

FOREIGN PATENT DOCUMENTS 0368732  5/1990  European Pat. Off. ............ 156/643

*Primary Examiner*—William A. Powell
*Attorney, Agent, or Firm*—Angus C. Fox, III

[57] ABSTRACT

An enhanced halogenated plasma for ion-assisted plasma etches to which silicon tetrabromide has been added to retard erosion, flowing and reticulation of photoresist, particularly during an etch of an aluminum or tungsten metal layer. The added resistance to erosion, flowing and reticulation is greater than that achieved through the addition of silicon tetrachloride to the same plasma. It is postulated that a silicon-containing layer is deposited on horizontal and vertical surfaces of photoresist at a faster rate than that possible for silicon tetrachloride. As with silicon tetrachloride, resist loss still occurs, but at a much reduced rate, with loss on the upper surfaces of the photoresist segments (these surfaces being perpendicular to the RF field of the reactor) occurring at a higher rate than loss on vertical surfaces (these surfaces being parallel to the RF field of the reactor).

4 Claims, 1 Drawing Sheet

ADDITION OF SILICON TETRABROMIDE TO HALOGENATED PLASMAS AS A TECHNIQUE FOR MINIMIZING PHOTORESIST DETERIORATION DURING THE ETCHING OF METAL LAYERS

FIELD OF THE INVENTION

This invention relates to semiconductor fabrication technology and, more specifically, to ion-assisted plasma etch processes.

BACKGROUND OF THE INVENTION

Photoresist is commonly used as a mask during ion-assisted plasma etch operations. For etches of silicon, silicon dioxide, silicon nitride, and other metallic and non-metallic compounds, photoresist displays sufficient durability and stability. However, when used to mask certain metals such as aluminum or tungsten during ion-assisted plasma etches, photoresist is eroded rapidly, develops a reticulate or shrivelled appearance, and becomes unstable to the point that it will flow.

Some six or seven years ago, it was discovered that the addition of silicon tetrachloride to halogenated plasmas tends to enhance the durability of photoresist during etch operations by causing an ongoing deposition of a silicon-containing film on the surface of the photoresist during the etch operation. Since the film is etched away at a rate considerably faster than the rate at which it is deposited, photoresist erosion is reduced. Erosion on sidewalls of photoresist mask segments is reduced significantly more than erosion on the tops of the segments. This means that mask pattern shrinkage is slowed, resulting in more accurate pattern transfers to the underlying layer. Although silicon tetrachloride retards erosion of the photoresist, it has little effect on the etch rate of the masked layer. Although silicon tetrachloride significantly improves the performance of photoresist during ion-assisted plasma etches, erosion, reticulation and flowing are still significant problems.

SUMMARY OF THE INVENTION

This invention provides a means of providing even greater protection to photoresist from erosion, reticulation and flowing during ion-assisted plasma etches (also termed "reactive-ion etches") than that provided by the introduction of silicon tetrachloride into the etch plasma. This is accomplished by introducing silicon tetrabromide into the plasma. For example, when silicon tetrabromide is introduced into a plasma reactor during an ion-assisted etch of aluminum or tungsten, erosion, reticulation and flowing of photoresist is reduced to a greater degree than that achievable through the addition of silicon tetrachloride. It is postulated that a silicon-containing layer is deposited on horizontal and vertical surfaces of photoresist at a faster rate than that possible for silicon tetrachloride. As with silicon tetrachloride, resist loss still occurs, with loss on the upper surfaces of the photoresist segments (these surfaces being perpendicular to the RF field of the reactor) occurring at a higher rate than loss on vertical surfaces (these surfaces being parallel to the RF field of the reactor).

PREFERRED EMBODIMENT OF THE INVENTION

Figure 1:
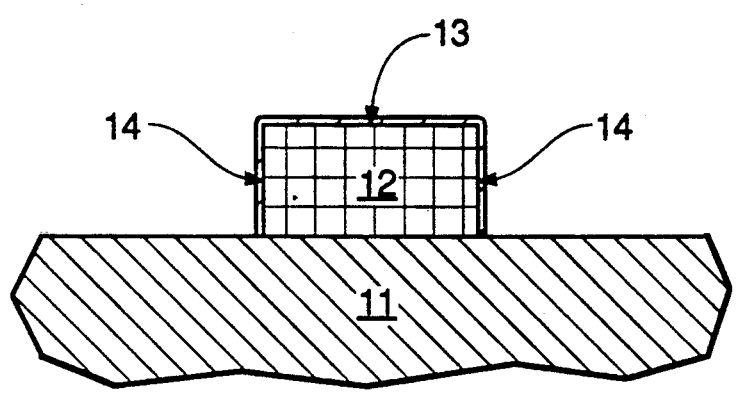
FIG. 1 is a cross-sectional view of a photoresist mask segment superjacent a layer being etched in an ion-assisted plasma.

Referring now to FIG. 1, a layer of material 11, such as metallic aluminum or tungsten, is patterned with a photoresist mask 12 and subjected to an etch plasma containing halogenated species (radicals and/or ions) in the presence of silicon tetrabromide. The concentration of silicon tetrabromide as a percentage (by molecular weight) of total gas flow through the plasma reactor is considered to within an optimal range of 5 to 50 percent. During the etch, erosion, reticulation and flowing of photoresist is reduced to a greater degree than that achievable through the addition of silicon tetrachloride in like concentrations into a like plasma. It is postulated that a silicon-containing layer is deposited on horizontal surfaces 13 and vertical surfaces 14 of the photoresist mask at a faster rate than that possible for silicon tetrachloride. As with silicon tetrachloride, resist loss still occurs, with loss on the horizontal surfaces 13 of the photoresist segments (these surfaces being perpendicular to the RF field of the reactor) occurring at a higher rate than loss on vertical surfaces 14 (these surfaces being parallel to the RF field of the reactor).

Although only a single embodiment of the process for creating a metal etch mask which may be utilized for halogen-plasma excavation of deep trenches has been disclosed, it will be apparent to those having ordinary skill in the art, that changes may be made thereto without departing from the spirit and the scope of the process as claimed.

I claim:

1. A method for performing reactive-ion etches of metal layers in a plasma reactor comprising the following steps:
    a) providing a partially fabricated integrated circuit structure having a metal layer on the upper surface thereof;
    b) partially covering the metal layer with a photoresist mask; and
    c) establishing a flow of gases through the reactor, said gases comprising silicon tetrabromide and compounds which ionize in an RF electric field to form halogenated species;
    d) subjecting the integrated circuit structure to a plasma created by establishing an RF electric field within the reactor.

2. The method for performing reactive-ion etches of claim 1, wherein the metal layer comprises aluminum.

3. The method for performing reactive-ion etches of claim 1, wherein the metal layer comprises tungsten.

4. The method for performing reactive-ion etches of claim 1, wherein silicon tetrabromide comprises 5 to 50 percent by molecular weight of total gas flow through the reactor.

* * * * *